United States Patent
Dvorak et al.

(10) Patent No.: US 7,473,609 B2
(45) Date of Patent: Jan. 6, 2009

(54) SURFACE TREATMENT IN PREPARATION FOR CONTACT PLACEMENT

(75) Inventors: Martin W. Dvorak, Santa Rosa, CA (US); Timothy C. Engel, Windsor, CA (US); Ronald J. Miller, Sebastopol, CA (US); Scott D. Lafrancois, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 626 days.

(21) Appl. No.: 11/093,113

(22) Filed: Mar. 29, 2005

(65) Prior Publication Data
US 2006/0223273 A1  Oct. 5, 2006

(51) Int. Cl.
*H01L 21/331* (2006.01)
(52) U.S. Cl. .............. 438/309; 438/597; 438/604; 257/E27.037
(58) Field of Classification Search .......... 438/309, 438/312, 317–320, 570, 573, 584, 597, 602, 438/604; 257/E29.094, E29.194, E21.108, 257/E21.387, E27.037
See application file for complete search history.

(56) References Cited

U.S. PATENT DOCUMENTS 4,611,388 A * 9/1986 Pande .................. 438/317
2004/0214401 A1* 10/2004 Krueger et al. ......... 438/317

OTHER PUBLICATIONS

Miloua et al., Structural and electrical characterizations of Ag-InP(100) interfaces stabilized by antimony, Materials Chemistry and Physics, 33 (1993) 85-88.*
N. Matine, et al. , "Fabrication and Characterization of InP Hetero jnction Bipolar Transistors with Emitter Edges Parallel to [010] nd {010] Crystal Orientations", Jpn. J. Appl. Phys. vol. 38 (1999) pp. 1200-1203. Part No. 2B,Feb. 1999, 1200-1203.
Eiichi Sano, et al., "High-Speed, Low-Power Lightwave Communication ICs Using InP/InGaAs Double-Heterojunction Bipolar Transistors", IEICE Trans. Electron., vol. E82-C, No. 11 Nov. 1999, pp. 2000-2006.

* cited by examiner

*Primary Examiner*—Brook Kebede

(57) ABSTRACT

A contact is formed on indium-phosphide material. Regions of the indium-phosphide material are exposed. An energetic bombardment is performed on exposed regions of the indium-phosphide material. Metal is deposited on the exposed regions of the indium-phosphide material where energetic bombardment occurred.

16 Claims, 6 Drawing Sheets

SURFACE TREATMENT IN PREPARATION FOR CONTACT PLACEMENT

BACKGROUND

In current processes used to produce a heterojunction bipolar transistor (HBT), a base/collector mesa etch is designed to stop on top of or within a subcollector contact layer. For HBTs grown on an indium-phosphide (InP) substrate, the contact layer is typically composed of gallium-indium-arsenic (GaInAs). With contact layers composed of GaInAs, specific contact resistivies of $1\times10^{-7}$ Ohm-centimeter$^2$ are typically obtained with non-alloyed low Ohmic metal composed of, for example titanium (Ti), platinum (Pt) and/or gold (Au).

When a base collector mesa etch involving a final aqueous acid etch—such as a solution of water ($H_2O$) and hydrochloric acid (HCl) at a 1 to x mixture where x is less than or equal to 1, or such as a solution of phosphoric acid ($H_3PO_4$) and HCl at a 1 to x mixture for all x—is employed, then the InP over the collector region is removed selectively and a GaInAs subcollector contact layer is not etched. See for example, N. Matine, M. W. Dvorak, J. L. Pelouard, F. Pardo, and C. R. Bolognesi, "Fabrication and characterization of InP HBTs with emitter edges parallel to [001] and [010] crystal orientations," Jap. J. Appl. Phys. Part 1, vol. 38, no. 2B, pp. 1200-1203, 1999. Such a contact layer may be kept very thin (e.g., 50 Angstroms) and still function as an etch stop because of the excellent selectivity in HCl based etches.

When a dry etch is used to perform the base collector mesa etch, selectivities are far inferior or nonexistent than when a final aqueous acid etch is used. The dry etch, therefore, requires that much thicker GaInAs contact layers be used. For example, when a dry etch is used, the GaInAs contact layers are typically required to be many hundreds of Angstroms to a few thousand Angstroms thick. However, the thermal conductivity of GaInAs is approximately 0.05 Watts per centimeter° Kelvin (W/cm° K) compared to approximately 0.68 W/cm° K for InP. This makes thermal management much more difficult with the presence of GaInAs in the subcollector. See, for example, E. Sano, K. Kunshima, H. Nakajima, and S. Yamahata, High-speed, low-power lightwave communication ICs using InP/InGaAs double-heterojunction bipolar transistors," IEICE Trans. Electron., vol. E82-C, no. 11, pp. 2000-2006, 1999. For this reason a GaInAs contact has not been compatible with a dry etch base/collector mesa etch.

Furthermore, the common approach of using sintered Ohmic contacts (e.g. gold-germanium-nickel (AuGeNi)) is not compatible with HBT fabrication, because typical sintering cycle temperatures of approximately 400° C. (typical for gold-germanium (AuGe) eutectic alloying) are incompatible with already present emitter and base Ohmic contacts.

SUMMARY OF THE INVENTION

In accordance with an embodiment of the present invention, a contact is formed on indium-phosphide material. Regions of the indium-phosphide material are exposed. An energetic bombardment is performed on exposed regions of the indium-phosphide material. Metal is deposited on the exposed regions of the indium-phosphide material where energetic bombardment occurred.

DESCRIPTION OF THE EMBODIMENT

FIGS. 1 through 6 illustrate a single step dry etch process to produce a low resistivity Ohmic contact. The process requires no special epitaxial layer growth of narrow bandgap GaInAs material. For example, the dry etch process is used to form a contact layer on InP during a base/collector mesa fabrication. No or mild sinter is required. The disclosed dry etch process is compatible with the elimination of GaInAs from the subcollector. This improves (i.e., decreases) thermal resistance in the resulting device, thereby reducing junction temperatures and circuit self-heating temperature rise at a given set of operating currents and voltages. This improves device reliability. Also, for given maximum junction temperature rise and circuit self-heating temperature rise, this can increase operating currents and/or voltages, thereby reducing switching times and thus increase operating frequencies of circuitry employing this device. All HBT circuits require low collector contact resistance, and this process, like the more conventional processes involving collector metal deposited on a GaInAs contact layer on InP, provides adequately low collector resistances.

Figure 1:
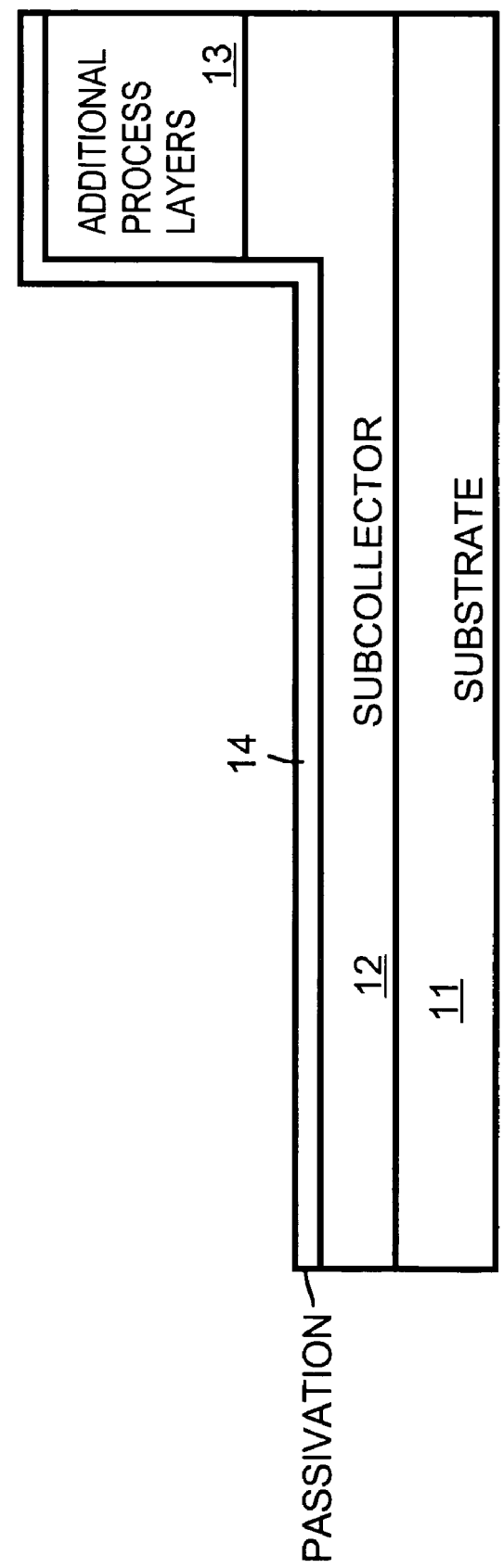
FIG. 1, FIG. 2, FIG. 3, FIG. 4, FIG. 5 and FIG. 6 illustrate process steps pertaining to the placement of a contact in accordance with an embodiment of the present invention.

FIG. 1 shows a stage in the formation of a device such as a heterojunction bipolar transistor (HBT). FIG. 1 is for illustrative purposes and is not to scale. A substrate 11 is composed of, for example, semi-insulating InP. A subcollector layer 12, placed over substrate 11, is composed of, for example, InP material heavily doped with silicon. A passivation layer 14 is composed of, for example, silicon nitride or oxide. Alternatively, passivation layer 14 can omitted at this point and replaced by use of another passivation layer formed later in processing. Additional process layers 13 represent layers of material, implementing an HBT, on a mesa area.

Figure 2:
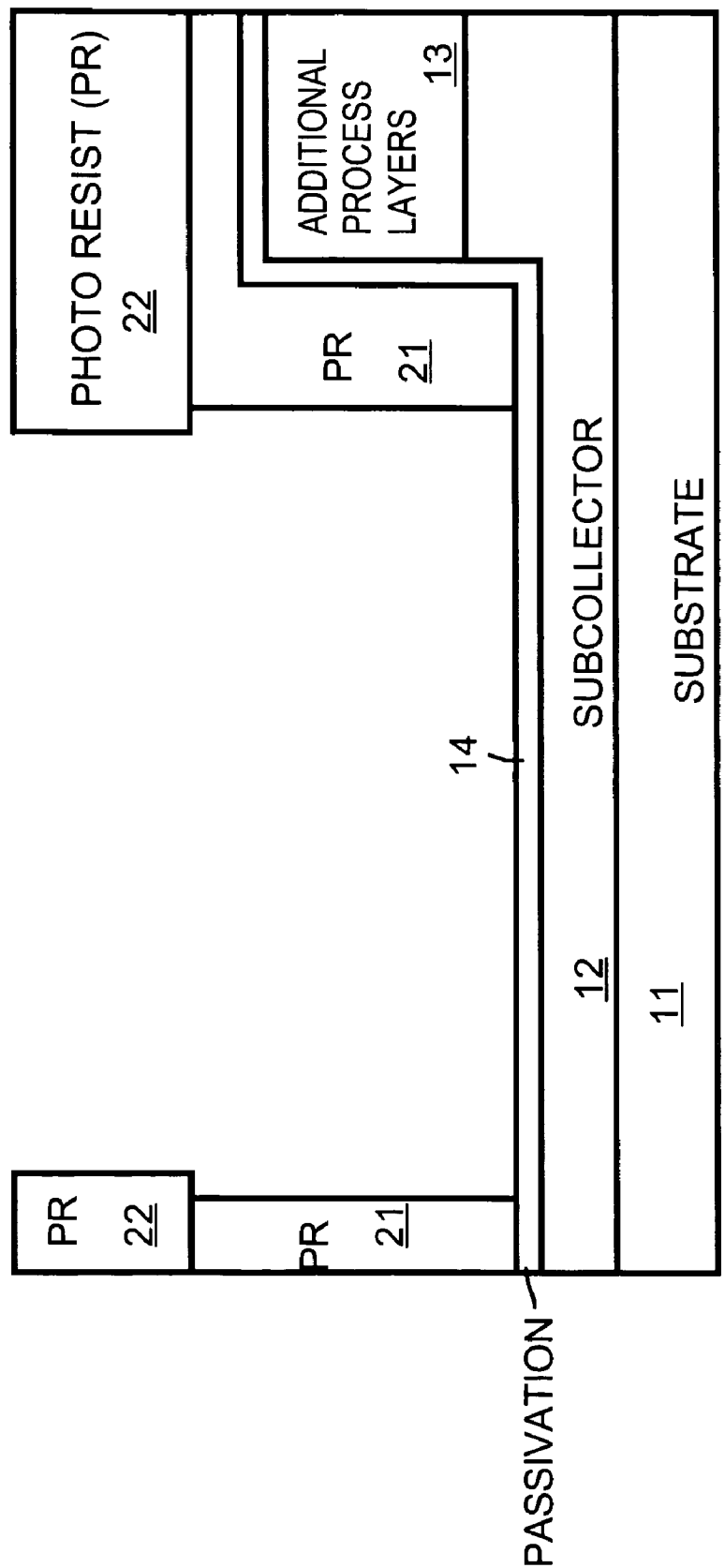
Figure 3:
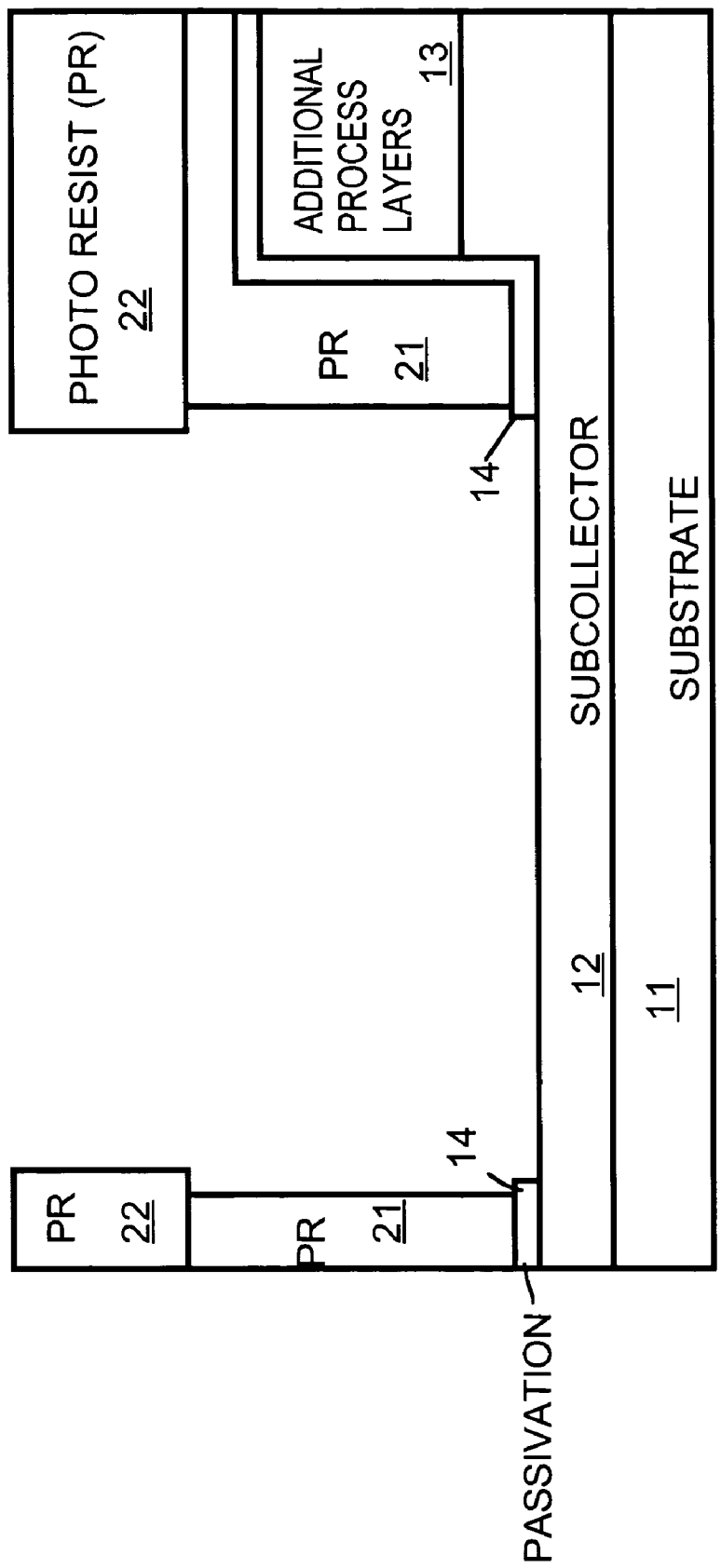

FIG. 2 shows the result after a photoresist layer 21 used for lift undercut, and a photoresist layer 22, used as patterning resist, have been deposited. As illustrated by FIG. 2, lithography has been used to pattern an opening through photoresist layer 21 and photoresist layer 22. The openings are locations where collector Ohmic contacts will be formed.

Figure 4:
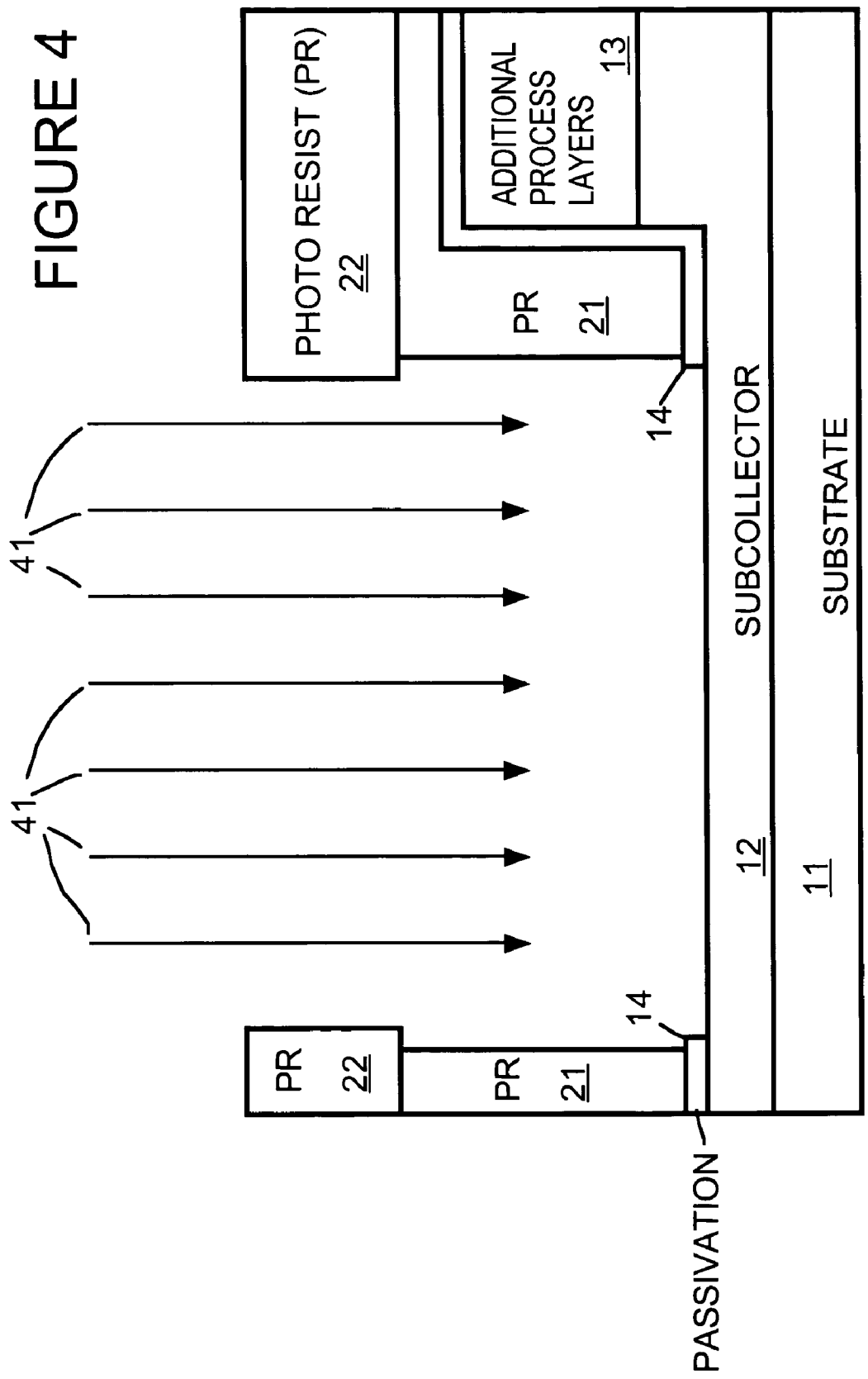

As shown in FIG. 4 an etch of passivation layer 14 is performed. For example, the etch is a dry etch using, for example, fluorine-based plasma or the etch is a wet etch using, for example, a hydrogen fluoride (HF) aqueous solution. The etch of passivation layer 14 exposes subcollector layer 12.

FIG. 4 illustrates an intentional surface treatment to prepare the surface of subcollector layer 12 for deposition of contact material. The surface treatment is illustrated by arrows 41, which represent an energetic bombardment. For example, the energetic bombardment is a sputter process using inert material, such as Argon (Ar) or is a sputter process using chemically active ions. Alternatively, the energetic bombardment is another bombardment process such as an ion mill or plasma etch. For example, the surface treatment is performed under vacuum. As a result of the surface treatment, the surface of subcollector layer 12 may end up non-stoichiometric.

Figure 5:
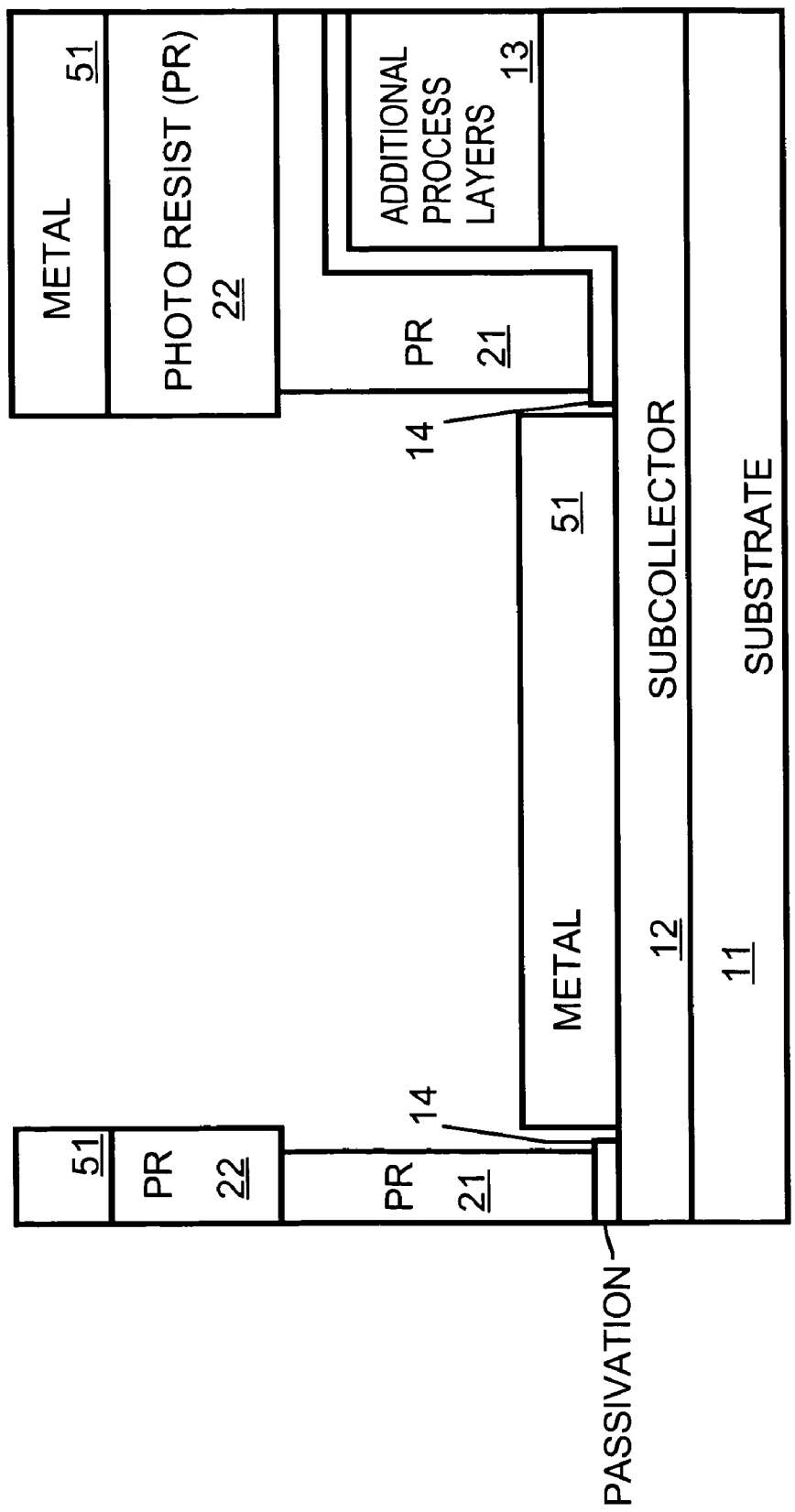

FIG. 5 shows the deposit of a metal layer 51. For example, metal layer 51 is deposited in a high-vacuum system in an in situ process, for example, immediately following and in the same processing chamber as a sputter process used to roughen the surface of subcollector layer 12. Alternatively, metal layer 51 is deposited ex situ after subcollector layer 12 is exposed to air during clean-up of subcollector layer 12 after the intentional bombardment. For example, the clean-up includes a one step or multiple step process. For example the clean-up can be performed using an aqueous solution such as HCl and de-ionized water, mixed at a 1 to 2 ratio of HCl to de-ionized water, followed by a rinse using de-ionized water. Alternatively, other acids used in solution with de-ionized water can be used for clean-up, followed, for example, by a rinse using de-ionized water. After the rinse, a wafer spin dry or blow dry process using a nitrogen gun can be used to avoid staining which can result when no special drying process is used.

Figure 6:
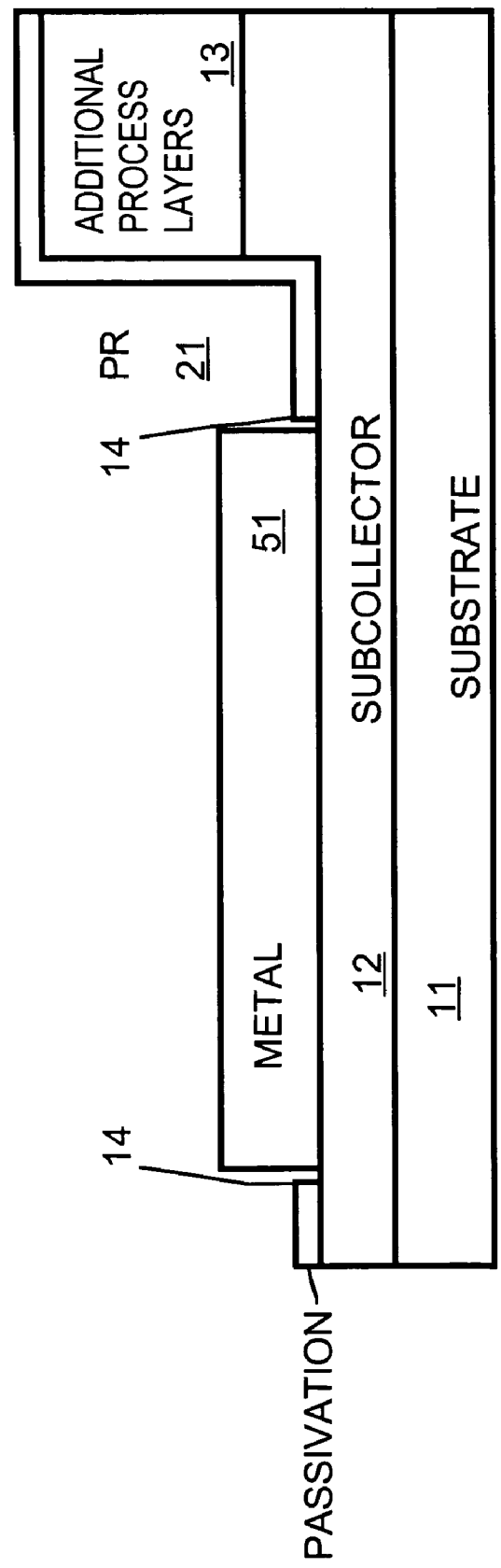

FIG. 6 shows the result of a resist removal, which removes photoresist layer 21, photoresist area 22 and also lifts portions of metal layer 51 that were on top of photoresist layer 22. The portions of metal layer 51 deposited on subcollector layer 12 remain and function as a low-resistance Ohmic contact.

In the process illustrated by FIGS. 1 through 6, no intentional alloying or sintering is required, except, however that ordinary wafer processing following deposition of metal layer 51 may involve anneals of many minutes at 300° C. and hours at 250° C. The low temperature anneals are sufficient to stabilize the Ohmic contact resistance.

While the described embodiment of the present invention was described in the context of forming collector Ohmic contacts on heterojunction bipolar transistors, the process is generally useful, for example, for any process on which low-resistance Ohmic contacts are placed on a material such as InP. For example, the process is useful for forming an emitter contact region for a heterojunction bipolar transistor, is useful for forming an ohmic contact on a diode and is useful for forming an ohmic contact on a field effect transistor.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for forming a contact on indium-phosphide material, comprising:
   exposing regions of the indium-phosphide material;
   performing an energetic bombardment of exposed regions of the indium-phosphide material; and,
   depositing metal on the exposed regions of the indium-phosphide material where energetic bombardment occurred;
   wherein the metal is deposited in an in situ process performed immediately following the energetic bombardment.

2. A method as in claim 1, wherein exposing regions of the indium-phosphide material is accomplished by removing a passivation layer over portions of the indium-phosphide material.

3. A method as in claim 1 wherein the indium-phosphide material is a subcollector region for a heterojunction bipolar transistor.

4. A method as in claim 1 wherein the indium-phosphide material is an emitter region for a heterojunction bipolar transistor.

5. A method as in claim 1 wherein the indium-phosphide material is an ohmic contact for a diode.

6. A method as in claim 1 wherein the indium-phosphide material is an ohmic contact for a field effect transistor.

7. A method as in claim 1 wherein the energetic bombardment is one of the following:
   a sputter process using inert material;
   a sputter process using chemically active ions;
   an ion mill;
   a plasma etch.

8. A method as in claim 1 wherein the metal is used as a low-resistance Ohmic contact.

9. A method for forming a contact on indium-phosphide material, comprising:
   exposing regions of the indium-phosphide material;
   performing an energetic bombardment of exposed regions of the indium-phosphide material; and,
   depositing metal on the exposed regions of the indium-phosphide material where energetic bombardment occurred;
   wherein the metal is deposited in an ex situ process where an aqueous process is used to clean the bombarded indium-phosphide material before deposition of the metal.

10. A method as in claim 9 wherein the aqueous process includes a rinse using an acid and de-ionized water.

11. A method for forming a contact region on a device, the method comprising:
   removing passivation material to expose contact regions of the device;
   performing an energetic bombardment of the exposed contact regions; and
   depositing low-resistance Ohmic contact metal on the exposed contact regions where energetic bombardment occurred;
   wherein the low-resistance Ohmic contact metal is deposited in an in situ process performed immediately following the energetic bombardment.

12. A method as in claim 11 wherein the energetic bombardment is one of the following:
   a sputter process using inert material;
   a sputter process using chemically active ions;
   an ion mill;
   a plasma etch.

13. A method as in claim 11 wherein the contact regions, before deposition of the low-resistance Ohmic contact metal, are composed of indium-phosphide.

14. A method as in claim 11 wherein the device comprises a heterojunction bipolar transistor.

15. A method for forming a contact region on a device, the method comprising:
   removing passivation material to expose contact regions of the device;
   performing an energetic bombardment of the exposed contact regions; and
   depositing low-resistance Ohmic contact metal on the exposed contact regions where energetic bombardment occurred;
   wherein the low-resistance Ohmic contact metal is deposited in an ex situ process where an aqueous process is used to clean the bombarded indium-phosphide material before deposition of the low-resistance Ohmic contact metal.

16. A method as in claim 15 wherein the aqueous process includes a rinse using an acid and de-ionized water.

* * * * *